(12) United States Patent
Nakamura

(10) Patent No.: US 11,211,431 B2
(45) Date of Patent: Dec. 28, 2021

(54) DISPLAY DEVICE

(71) Applicant: Sharp Kabushiki Kaisha, Sakai (JP)

(72) Inventor: Kohzoh Nakamura, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 37 days.

(21) Appl. No.: 16/634,893

(22) PCT Filed: Jul. 31, 2017

(86) PCT No.: PCT/JP2017/027696
§ 371 (c)(1),
(2) Date: Jan. 29, 2020

(87) PCT Pub. No.: WO2019/026131
PCT Pub. Date: Feb. 7, 2019

(65) Prior Publication Data
US 2020/0235173 A1    Jul. 23, 2020

(51) Int. Cl.
*H01L 27/32*    (2006.01)
(52) U.S. Cl.
CPC ...... *H01L 27/3218* (2013.01); *H01L 27/3216* (2013.01); *H01L 27/3276* (2013.01)
(58) Field of Classification Search
None
See application file for complete search history.

(56) References Cited

U.S. PATENT DOCUMENTS

| | | | |
|---|---|---|---|
| 7,646,398 B2 | 1/2010 | Brown Elliott | |
| 2010/0013853 A1 | 1/2010 | Takatori | |
| 2015/0379924 A1* | 12/2015 | Matsueda | H01L 27/3218 345/690 |
| 2016/0240593 A1* | 8/2016 | Gu | H01L 27/3262 |
| 2017/0131594 A1 | 5/2017 | Nakada et al. | |
| 2017/0179206 A1 | 6/2017 | Lee et al. | |
| 2017/0186836 A1 | 6/2017 | Tada et al. | |

(Continued)

FOREIGN PATENT DOCUMENTS

| | | |
|---|---|---|
| JP | 2015-084104 A | 4/2015 |
| JP | 2016-009636 A | 1/2016 |
| JP | 2016-090595 A | 5/2016 |

(Continued)

OTHER PUBLICATIONS

Official Communication issued in International Patent Application No. PCT/JP2017/027696, dated Oct. 31, 2017.

*Primary Examiner* — Jay C Chang

(74) *Attorney, Agent, or Firm* — Keating & Bennett, LLP

(57) ABSTRACT

A first subpixel and a second subpixel that are adjacent to each other in a row direction, a third subpixel, and a fourth subpixel and a fifth subpixel that are adjacent to each other in the row direction are provided. Each of the first subpixel and the fourth subpixel that are arrayed in a column direction includes a first-color light-emitting layer. Each of the second subpixel and the fifth subpixel that are arrayed in the column direction includes a second-color light-emitting layer. The third subpixel including a third-color light-emitting layer is adjacent in a diagonal direction to or adjacent in the column direction to at least two of the first subpixel, the second subpixel, the fourth subpixel, and the fifth subpixel.

15 Claims, 14 Drawing Sheets

(56) References Cited

U.S. PATENT DOCUMENTS

2017/0294491 A1* 10/2017 Jo ........................ G09G 3/2003

FOREIGN PATENT DOCUMENTS

| JP | 2016-537688 A | 12/2016 |
| JP | 2017-090916 A | 5/2017 |
| JP | 2017-116598 A | 6/2017 |
| JP | 2017-116688 A | 6/2017 |

* cited by examiner

DISPLAY DEVICE

TECHNICAL FIELD

The disclosure relates to a display device.

BACKGROUND ART

PTL 1 discloses a configuration in which a data line is provided to a subpixel row in which red subpixels and green subpixels are alternately arrayed in a column direction and each of the red subpixels and each of the green subpixels are connected to the data line.

CITATION LIST

Patent Literature

PTL 1: U.S. Pat. No. 7,646,398

SUMMARY

Technical Problem

The configuration in PTL 1 has a problem in that a charging rate of the subpixels is low.

Solution to Problem

A display device according to one aspect of the disclosure includes a first subpixel and a second subpixel that are adjacent to each other in a row direction, a third subpixel, and a fourth subpixel and a fifth subpixel that are adjacent to each other in the row direction, wherein each of the first subpixel and the fourth subpixel that are arrayed in a column direction includes a first-color light-emitting layer, each of the second subpixel and the fifth subpixel that are arrayed in the column direction includes a second-color light-emitting layer, and the third subpixel including a third-color light-emitting layer is adjacent in a diagonal direction to or adjacent in the column direction to at least two of the first subpixel, the second subpixel, the fourth subpixel, and the fifth subpixel. Note that the row direction and the column direction are two directions perpendicular to each other, and the diagonal direction is set with the two directions as references.

Advantageous Effects of Disclosure

According to the one aspect of the disclosure, the charging rate of the subpixels can be increased.

DESCRIPTION OF EMBODIMENTS

Figure 1:
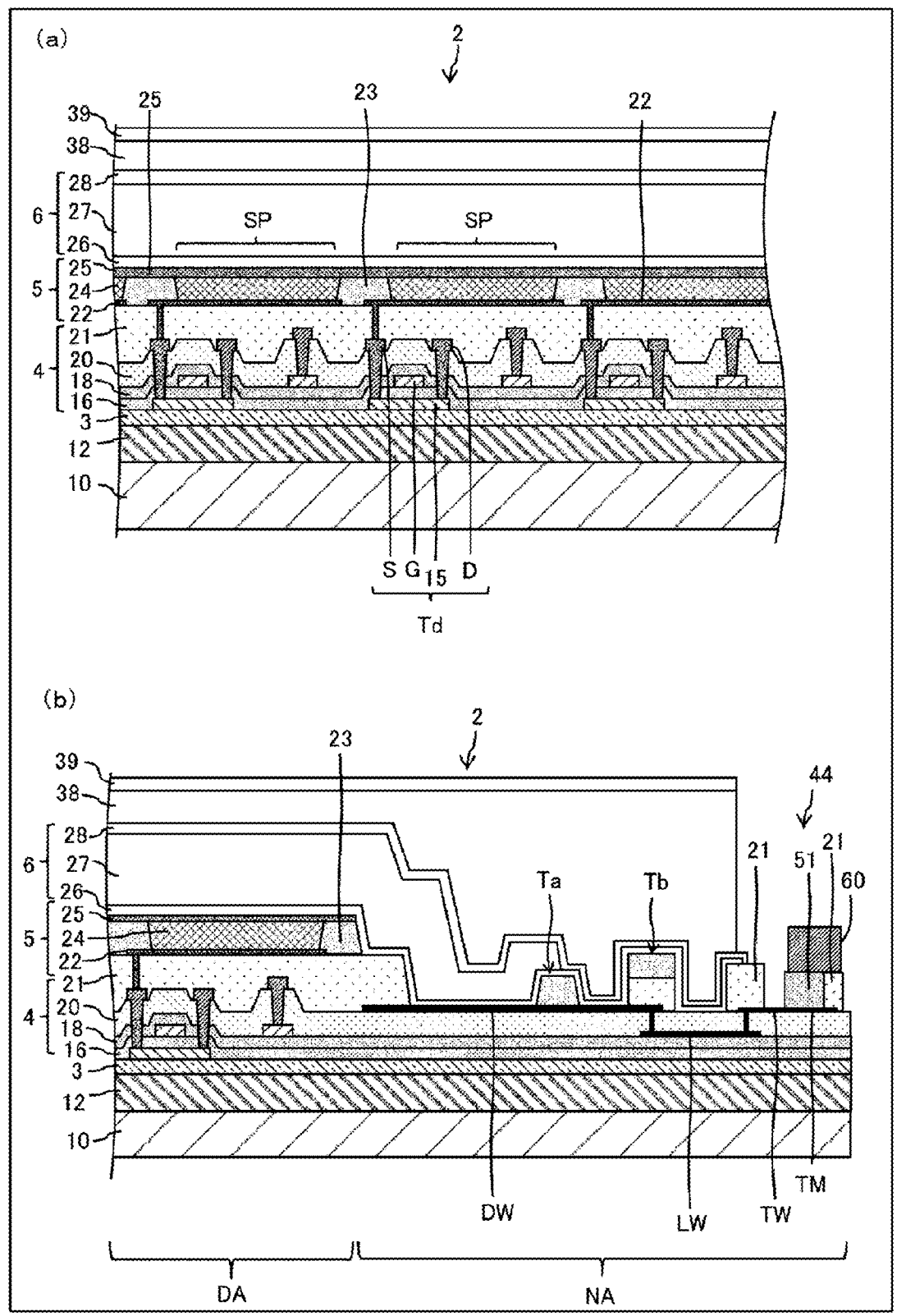
FIG. 1 is a cross-sectional view illustrating a configuration example of a display device.

FIG. 1 is a cross-sectional view illustrating a configuration example of a display device. A display device 2 of FIG. 1 is a top-emitting type that emits light upward, and includes a base material 10, a resin layer 12, a barrier layer 3 (undercoat layer), a thin-film transistor (TFT) layer 4, a light-emitting element layer 5, a sealing layer 6, an adhesive layer 38, and a function film 39, in that order from a lower side.

Examples of the material of the resin layer 12 include polyimide, epoxy, and polyamide. Examples of the material of the base material 10 include polyethylene terephthalate (PET).

The barrier layer 3 is a layer that inhibits moisture or impurities from reaching the TFT layer 4 or the light-emitting element layer 5 when the display device is being used, and can be constituted by a silicon oxide film, a silicon nitride film, or a silicon oxynitride film, or by a layered film of these, for example, formed using chemical vapor deposition (CVD).

The TFT layer 4 includes a semiconductor film 15, an inorganic insulating film 16 formed in a layer above the semiconductor film 15, a gate electrode G formed in a layer above the inorganic insulating film 16, an inorganic insulating film 18 formed in a layer above the gate electrode G, a capacitance wiring line C formed in a layer above the inorganic insulating film 18, an inorganic insulating film 20 formed in a layer above the capacitance wiring line C, a source electrode S and a drain electrode D both formed in a layer above the inorganic insulating film 20, and a flattening film 21 formed in a layer above the source electrode S and the drain electrode D.

A thin-film transistor Td (light emission control transistor) is configured to include the semiconductor film 15, the inorganic insulating film 16 (the gate insulating film), and the gate electrode G. The source electrode S is connected to a source region of the semiconductor film 15, and the drain electrode D is connected to a drain region of the semiconductor film 15.

The semiconductor film 15 is formed of low-temperature polysilicon (LTPS) or an oxide semiconductor, for example. Note that, although the TFT provided with the semiconductor film 15 as the channel is illustrated as having a top gate structure in FIG. 2, the TFT may have a bottom gate structure (when channel of the TFT is formed in an oxide semiconductor, for example).

The inorganic insulating films 16, 18, and 20 can be constituted, for example, by a silicon oxide (SiOx) film or a silicon nitride (SiNx) film, or a layered film of these, formed using CVD. The flattening film (interlayer insulating film) 21 can be constituted, for example, by a coatable photosensitive organic material, such as a polyimide, an acrylic, or the like.

The gate electrode G, the source electrode S, the drain electrode D, and the terminal are formed of a metal single layer film or a layered film including, for example, at least one of aluminum (Al), tungsten (W), molybdenum (Mo), tantalum (Ta), chromium (Cr), titanium (Ti), and copper (Cu).

The terminal portion 44 is provided on an end portion (a non-active area NA that does not overlap with the light-emitting element layer 5) of the TFT layer 4. The terminal portion 44 includes a terminal TM that is used for connecting with an IC chip or the electronic circuit board 60 such as an FPC and a terminal wiring line TW that is connected to the terminal TM. The terminal wiring line TW is electrically connected to various wiring lines of the TFT layer 4 with a relay wiring line LW and a lead-out wiring line DW therebetween.

The terminal TM, the terminal wiring line TW, and the lead-out wiring line DW are formed in the same process as that of the source electrode S, for example, and thus, are formed in the same layer (on the inorganic insulating film 20) and of the same material (two layers of titanium film and an aluminum film sandwiched between the two layers of titanium film, for example) as those of the source electrode S. The relay wiring line LW is formed in the same process as that of the capacitance electrode C, for example. End faces (edges) of the terminal TM, the terminal wiring line TW, and the lead-out wiring line DW are covered by the flattening film 21.

The light-emitting element layer 5 (an organic light-emitting diode layer, for example) includes an anode electrode 22 formed in a layer above the flattening film 21, a bank 23 that defines a subpixel of an active area DA (a region that overlaps with the light-emitting element layer 5), a light-emitting layer 24 formed in a layer above the anode electrode 22, and a cathode electrode 25 formed in a layer above the EL layer 24, and a light-emitting element (an organic light-emitting diode (OLED), for example) is configured to include the anode electrode 22, the light-emitting layer 24, and the cathode electrode 25.

The bank 23 covers an edge of the anode electrode 22, and the light-emitting layer 24 is formed in a region (a light-emitting region) surrounded by the bank 23, using vapor deposition or an ink-jet method. In a case where the light-emitting element layer 5 is an organic light-emitting diode (OLED) layer, for example, a hole injection layer, a hole transport layer, the light-emitting layer 24, an electron transport layer, and an electron injection layer are layered above a bottom surface of the bank (a part where the anode electrode 22 is exposed). Here, the layers aside from the light-emitting layer 24 can be common layers.

The anode electrode (anode electrode) 22 is formed by layering Indium Tin Oxide (ITO) and an alloy containing Ag, for example, and has light reflectivity (to be described below in more detail). The cathode electrode 25 can be constituted by a light-transmissive conductive material such as Indium Tin Oxide (ITO) and Indium Zinc Oxide (IZO).

If the light-emitting element layer 5 is an OLED layer, positive holes and electrons recombine inside the light-emitting layer 24 in response to a drive current between the anode electrode 22 and the cathode electrode 25, and light is emitted as a result of excitons, which are generated by the recombination, falling into a ground state. Since the cathode electrode 25 is translucent and the anode electrode 22 is light-reflective, the light emitted from the light-emitting layer 24 travels upwards and results in top emission.

The light-emitting element layer 5 may be used not only in a case of constituting the OLED element, but also in a case of constituting an inorganic light-emitting diode or a quantum dot light-emitting diode.

A protruding body Ta and a protruding body Tb that define edges of the organic sealing film 27 are formed in the non-active area NA. The protruding body Ta functions as a liquid stopper when the organic sealing film 27 is applied using an ink-jet method, and the protruding body Tb functions as a backup liquid stopper. Note that a lower portion of the protruding body Tb is configured by the flattening film 21, and functions as a protection film for an end face of the lead-out wiring line DW. The bank 23, the protruding body Ta, and an upper portion of the protruding body Tb can be formed in the same process, for example, by using a coatable photosensitive organic material such as a polyimide, an epoxy, or an acrylic.

The sealing layer 6 is light-transmissive, and includes the inorganic sealing film 26 that covers the cathode electrode 25, an organic sealing film 27 formed in a layer above the inorganic sealing film 26, and an inorganic sealing film 28 that covers the organic sealing film 27. The inorganic sealing films 26, 28 may be made of a silicon oxide film, a silicon nitride film, a silicon oxynitride film, or a layered film of these, formed by CVD using a mask, for example. The organic sealing film 27 is thicker than the inorganic sealing films 26 and 28, is a translucent organic film, and can be fabricated from a coatable photosensitive organic material such as a polyimide or an acrylic. For example, after coating the inorganic sealing film 26 with an ink containing such an organic material using an ink-jet method, the ink is cured by UV irradiation. The sealing layer 6 covers the light-emitting element layer 5 and inhibits foreign matters, such as water and oxygen, from infiltrating to the light-emitting element layer 5.

The function film 39 has an optical compensation function, a touch sensor function, a protection function, or the like, for example. The electronic circuit board 60 is an IC chip or a flexible printed circuit board (FPC) that is mounted on the terminal TM through intermediation of an anisotropic conductive material 51, for example.

Figure 2:
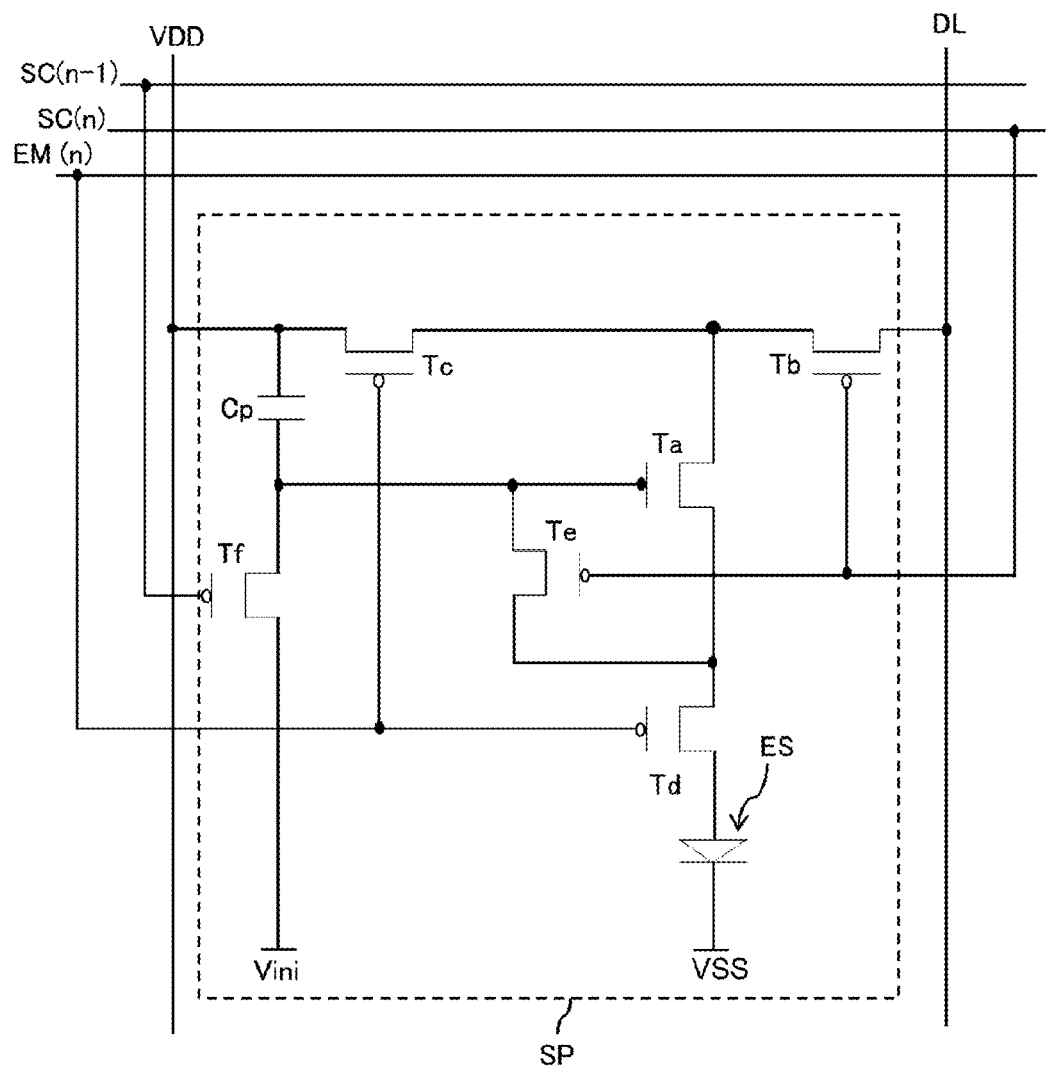
FIG. 2 is a circuit diagram illustrating a configuration example of a subpixel.

FIG. 2 is a circuit diagram illustrating a configuration example of a subpixel. The TFT layer 4 is provided with a plurality of data lines DL extending in the column direction, and a plurality of scanning lines SC(n) and a plurality of light emission control lines EM(n) extending in the row direction. A subpixel SP is connected to the data line DL and the scanning line SC(n). Note that a high-level power source VDD and a low-level power source VSS for driving the organic EL element, and an initialization voltage Vini are supplied to the subpixels SP. During the period in which the scanning line SC(n) is active, a potential signal corresponding to display gray scale data is supplied to the subpixels connected thereto from the data line DL.

The subpixel SP includes a drive transistor Ta, a switch transistor Tb, a power supply control transistor Tc, a light emission control transistor Td, a threshold voltage compensation transistor Te, an initialization transistor Tf, and an electrostatic capacitance Cp, which are formed in the TFT layer 4 illustrated in FIG. 2, and a light-emitting element ES (an organic light-emitting diode, for example) including the light-emitting layer 24, which is formed in the light-emitting element layer 5 illustrated in FIG. 2.

The drive transistor Ta includes a gate electrode which is connected with a source electrode of the threshold voltage compensation transistor Te, a drain electrode of the initialization transistor Tf, and one electrode of the capacitor Cp, a drain electrode which is connected with a source electrode of the switch transistor Tb and a source electrode of the power supply control transistor Tc, and a source electrode which is connected with a drain electrode of the light emission control transistor Td and a drain electrode of the threshold voltage compensation transistor Te.

The switch transistor Tb includes a gate electrode connected to the scanning line SC(n) of the n-th row, a drain electrode connected to the data line DL, and the source electrode which is connected to the drain electrode of the drive transistor Ta and the source electrode of the power supply control transistor Tc. The power supply control transistor Tc includes a gate electrode connected to the light emission control line EM(n) of the n-th row, a drain electrode which is connected to the supply line of the high-level power source VDD and the other electrode of the capacitor Cp, and the source electrode which is connected to the drain electrode of the drive transistor Ta and the source electrode of the switch transistor Tb.

The anode electrode 22 of the light-emitting element ES is connected to the drain electrode of the light emission control transistor Td, and the cathode electrode 25 of the light-emitting element ES is connected to the supply line of the low-level power source VSS.

First Embodiment

In the following, for ease of description, a transverse direction on the drawing sheet corresponds to a row direction, and a diagonal direction is relative to a row direction and a column direction (a vertical direction on the drawing sheet). Note that the row direction, for example, may have a parallel relationship, an orthogonal relationship, or a diagonal relationship with one edge (one side) of the display device. A subpixel is the smallest display component independently driven. A pixel is a subpixel group corresponding to one set of input signals (R signal, G signal, and B signal), and an SPR ratio is obtained by dividing the number of subpixels in one pixel by three (SPR ratio=the number of subpixels per pixel/3).

Figure 3:
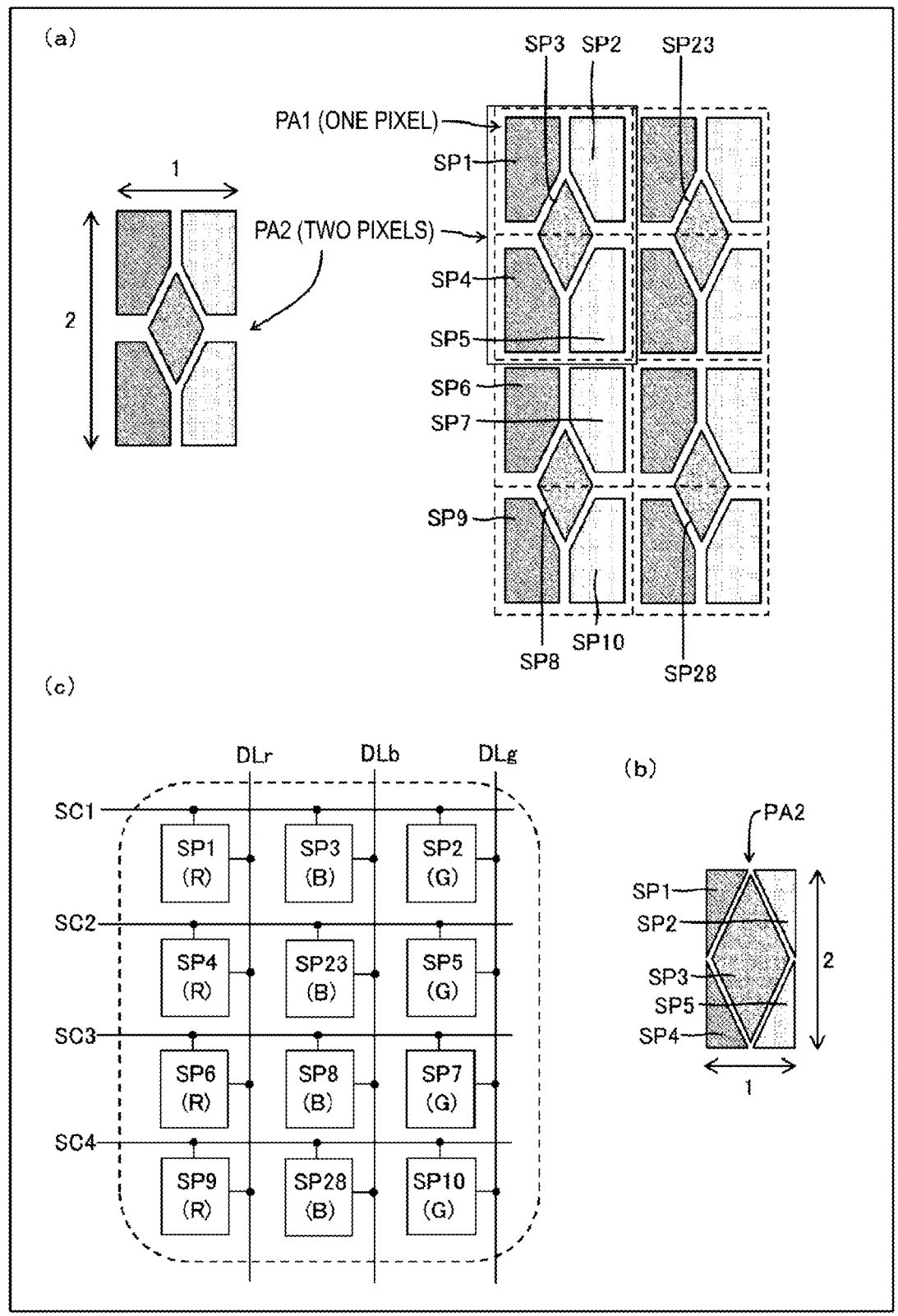
FIGS. 3(a) and 3(b) are schematic views illustrating arrangement of subpixels in a first embodiment.
FIG. 3(c) is a schematic view illustrating a connection relationship between the subpixels, scanning lines, and data lines.
Figure 4:
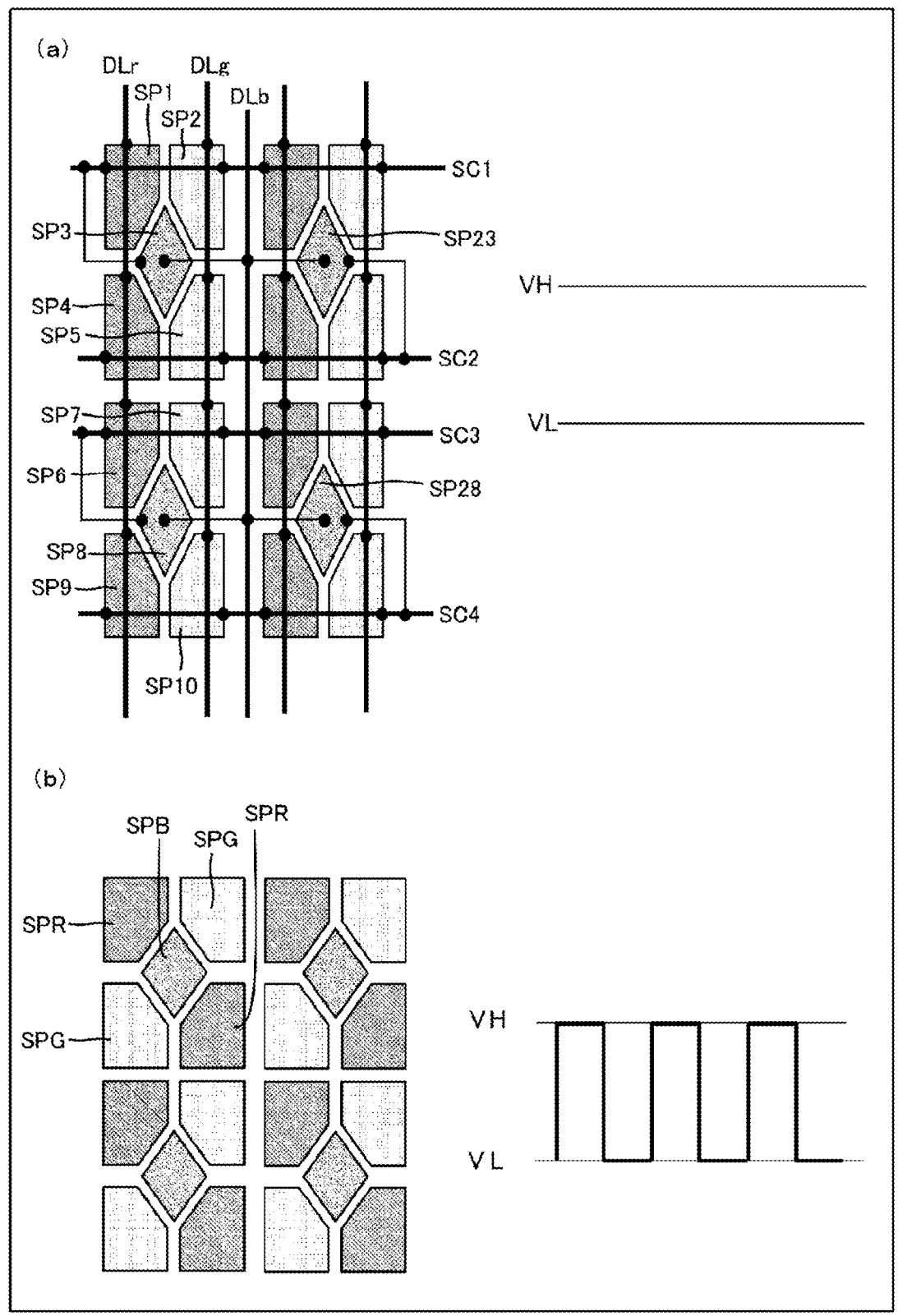
FIG. 4 is a schematic view illustrating an advantage of the first embodiment.

Each of FIGS. 3(a) and 3(b) are schematic views illustrating arrangement of subpixels in a first embodiment, and FIG. 3(c) is a schematic view illustrating a connection relationship between the subpixels, scanning lines, and data lines. FIG. 4 is a schematic view illustrating an advantage of the first embodiment. In FIG. 3, an equivalent of five subpixels is included in two pixel areas, and the SPR ratio being an input/output ratio of the subpixel is 5/6. A region PA1 (broken-line frame) in FIG. 3 corresponds to a one-pixel region, and a region PA2 corresponds to a two-pixel region. It is assumed that each of the subpixels has a configuration illustrated in FIG. 2, for example.

In FIG. 3, four subpixels SP1, SP4, SP6, and SP9 each including a red (R) light-emitting layer and having the same shape are arrayed in the column direction (the vertical direction, the extending direction of the data lines), and are connected to a data line DLr. Four subpixels SP2, SP5, SP7, and SP10 each including a green (G) light-emitting layer and having the same shape are arrayed in the column direction, and are connected to a data line DLg. Four subpixels SP3 and SP8 each including a blue (B) light-emitting layer and having the same shape are arrayed in the column direction, and are connected to a data line DLb.

The subpixels SP1 and SP2 are adjacent to each other in the row direction (the transverse direction, the extending direction of the scanning lines), the subpixels SP4 and SP5 are adjacent to each other in the row direction, the subpixels SP6 and SP7 are adjacent to each other in the row direction, the subpixels SP9 and SP10 are adjacent to each other in the row direction, the subpixels SP3 is adjacent to the subpixels SP1, SP2, SP4, and SP5 in the diagonal direction, and the subpixel SP8 is adjacent to the subpixels SP6, SP7, SP9, and SP10 in the diagonal direction.

With regard to the subpixels SP1 to SP5 (the first to the fifth subpixels), the light-emitting region of the subpixel SP3 has a vertical rhombic shape (one diagonal line is parallel to the row direction, and the other diagonal line is parallel to the column direction), and the light-emitting region of each of the subpixel SP1, the subpixel SP2, the subpixel SP4, and the subpixel SP5 has a pentagonal shape (see FIG. 3(a)) or a triangular shape (see FIG. 3(b)) including an oblique side along the light-emitting region of the subpixel SP3.

In this case, the subpixels SP1, SP3, and SP2 are connected to a scanning line SC1 (a first scanning line), the subpixels SP4 and SP5 are connected to a scanning line SC2 (a second scanning line), the subpixels SP6, SP8, and SP7 are connected to a scanning line SC3, and the subpixels SP9 and SP10 are connected to a scanning line SC4.

According to the configuration in FIG. 3, a frequency of a potential signal to be applied to the data lines (DLr, DLb, DLg) can be suppressed low, and hence the charging rate of the capacitance Cp of each subpixel can be increased. For example, in a case where performing solid display, a signal potential of the data lines is constant (VL) as in FIG. 4(a).

Note that, in the configuration of PTL 1 illustrated in FIG. 4(b) (the configuration in which two red subpixels SPR diagonally face each other while sandwiching a blue subpixel SPB, and two green subpixels SPG diagonally face each other while sandwiching the blue subpixel SPB), for example, a signal potential of data lines changes at a high frequency even at the time of solid display, which arises a problem in that the charging rate of the capacitance Cp of the subpixel is reduced.

A size ratio of the row direction (the transverse direction) and the column direction (the vertical direction) of the light-emitting region PA2 (including two pixels) formed of the subpixels SP1 to SP5 is substantially 1:2 (the vertical direction is from 1.9 to 2.1 when the transverse direction is 1). Thus, as compared to the configuration in FIG. 4(b), the vertical lines (pixel rows) are thin, and display quality in the vertical direction can be enhanced. Further, a repetition cycle of the diagonal lines is short, and hence display quality in the diagonal direction can be enhanced.

According to the first embodiment, as illustrated in FIG. 3(c) and FIG. 4(a), the total number of the data lines can be set to 5/6 of the number in a case of the SPR ratio being 1.0 (real display). This is for reducing the number of data lines (DLb and the like), which are to be connected to the blue subpixels, to a half.

Figure 5:
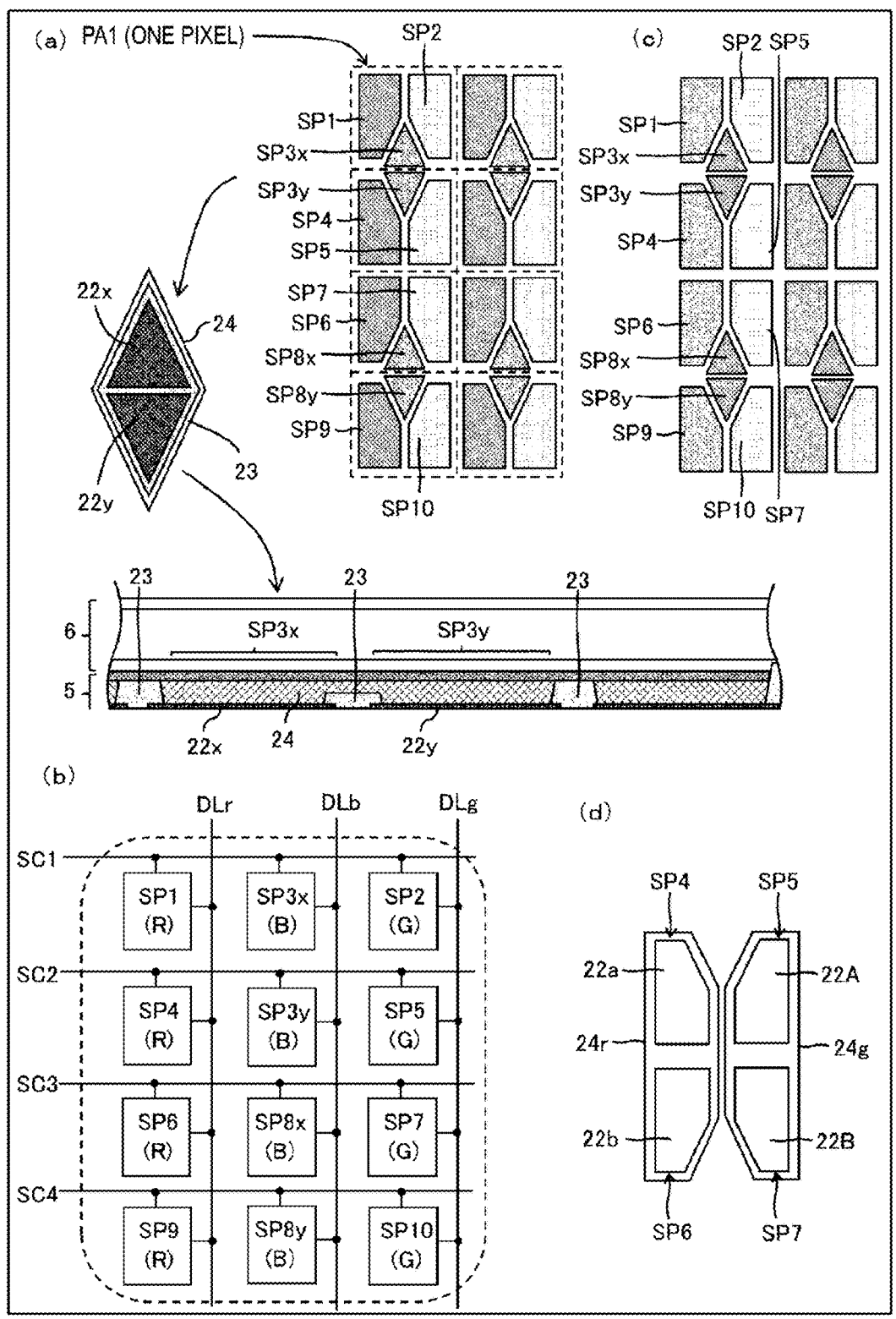
FIG. 5 is a schematic view illustrating a modification example of FIG. 3.

FIG. 5 is a schematic view illustrating a modification example of FIG. 3. As illustrated in FIG. 5(a), a configuration may be adopted in which the blue subpixel in FIG. 3 is divided into two subpixels arrayed in the column direction, and a light-emitting layer common to the two subpixels is provided so as to input a signal independently to the anode electrodes of those subpixels. Specifically, the anode electrodes of the two subpixels (a signal is input to those anode electrodes independently) are exposed below two adjacent openings formed in the insulating film of the light-emitting element layer, and the common light-emitting layer is provided so as to bridge a bank (edge cover) being a gap between the two openings. In this manner, while maintaining display quality with a high resolution, a resolution of a mask used during vapor deposition can be reduced, which facilitates manufacturing of the mask.

For example, the following configuration is adopted. Specifically, a base of an isosceles triangle anode electrode 22x and a base of an isosceles triangle anode electrode 22y are adjacent to each other in the column direction, a subpixel SP3x including the anode electrode 22x and a subpixel SP3y including the anode electrode 22y share one light-emitting layer 24 (blue), each of the subpixels SP3x and SP3y includes, for example, the configuration in FIG. 2, the subpixel SP3x is adjacent to the subpixel SP1 and the subpixel SP2 in the diagonal direction (the light-emitting region of each of the subpixels SP1 and SP2 includes an oblique line along the light-emitting region of the subpixel SP3x), the subpixel SP3y is adjacent to the subpixel SP4 and the subpixel SP5 in the diagonal direction (the light-emitting region of each of the subpixels SP4 and SP5 includes an oblique side along the light-emitting region of the subpixel SP3y).

In this case, as illustrated in FIG. 5(b), the subpixel SP3x is connected to the data line DLb and the scanning line SC1, and the subpixel SP3y is connected to the data line DLb and the scanning line SC2. In this manner, substantially real display (SPR ratio=1) can be achieved.

Note that, as illustrated in FIG. 5(c), a configuration may be adopted in which the subpixel SP1 includes a blue light-emitting layer, the subpixel SP2 includes a green light-emitting layer, and the subpixels SP3x and SP3y include a common red light-emitting layer. In this manner, by increasing the light-emitting region of the subpixel SP1 (blue), a service life of the blue subpixel, which is assumed to be shorter than those of the red and green subpixels, can be prolonged.

Note that, as in FIG. 5(d), a common light-emitting layer 24r (red) may be provided to the subpixels SP4 and SP6, and a common light-emitting layer 24g (green) may be provided to the subpixels SP5 and SP7. Specifically, an anode electrode 22a of the subpixel SP4 and an anode electrode 22b of the subpixel SP6 are separated from each other with the bank (partition), and the light-emitting layer 24r is provided so as to bridge the bank. Further, an anode electrode 22A of the subpixel SP5 and an anode electrode 22B of the subpixel SP7 are separated from each other with the bank (partition), and the light-emitting layer 24g is provided so as to bridge the bank. At the time of vapor deposition, one mask opening forms the light-emitting layer 24r, and one mask opening forms the light-emitting layer 24g.

Second Embodiment

Figure 6:
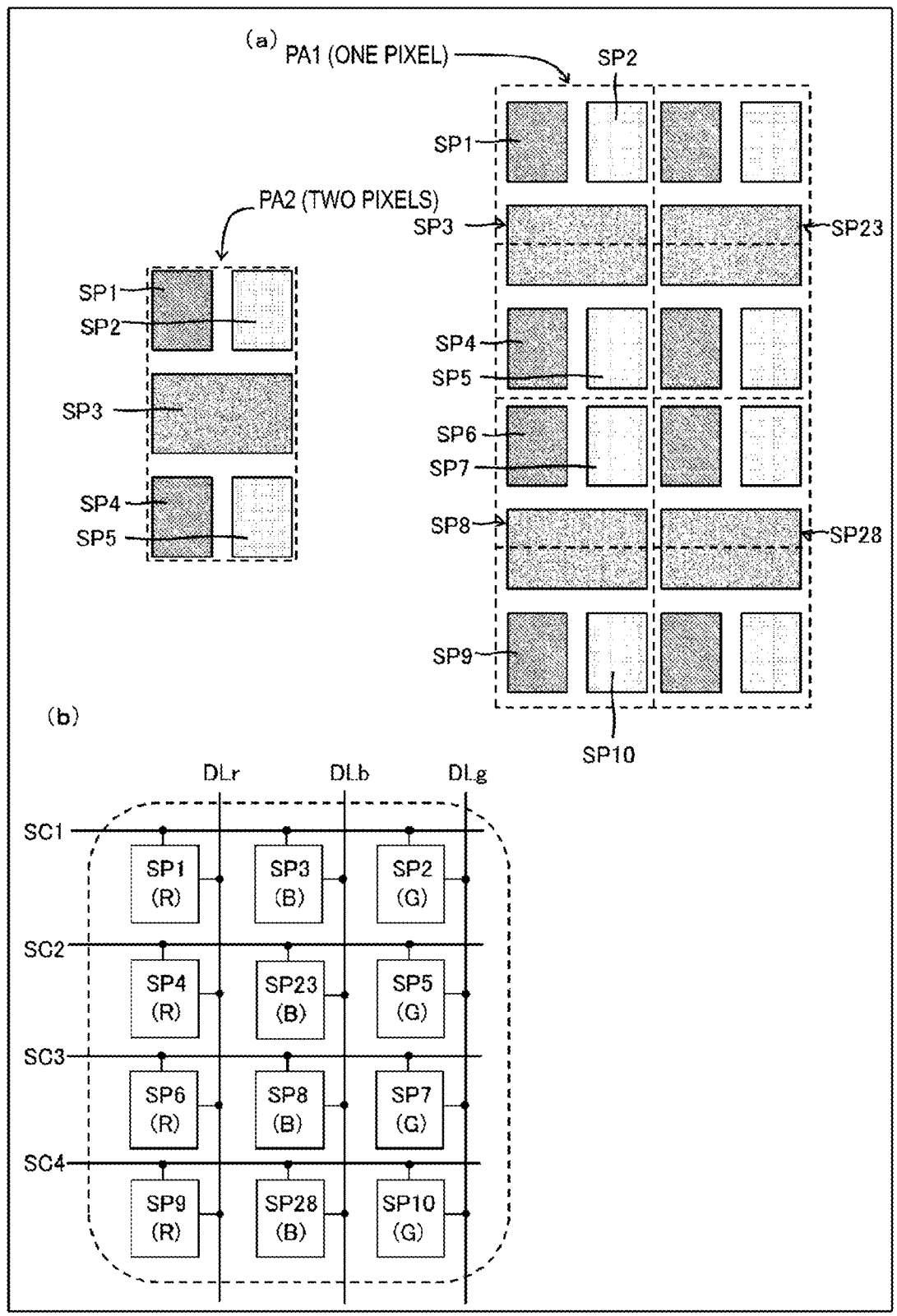
FIG. 6(a) is a schematic view illustrating arrangement of subpixels in a second embodiment.
FIG. 6(b) is a schematic view illustrating a connection relationship between the subpixels, the scanning lines, and the data lines.

FIG. 6(a) is a schematic view illustrating arrangement of subpixels in a second embodiment, and FIG. 6(b) is a schematic view illustrating a connection relationship between the subpixels, the scanning lines, and the data lines. In FIG. 6, an equivalent of five subpixels is included in two pixel areas, and the SPR ratio being an input/output ratio of the subpixel is 5/6. Note that the region PA1 (broken-line frame) in FIG. 6 corresponds to a one-pixel region.

In FIG. 6, four subpixels SP1, SP4, SP6, and SP9 each including a red light-emitting layer and having the same shape are arrayed in the column direction (the vertical direction, the extending direction of the data lines), and are connected to the data line DLr. Four subpixels SP2, SP5, SP7, and SP10 each including a green light-emitting layer and having the same shape are arrayed in the column direction, and are connected to the data line DLg. Two subpixels SP3 and SP8 each including a blue light-emitting layer and having the same shape are arrayed in the column direction, and are connected to the data line DLb. A subpixel SP23 adjacent to the subpixel SP3 in the row direction and a subpixel SP28 adjacent to the subpixel SP8 in the row direction are also connected to the data line DLb.

The subpixels SP1 and SP2 are adjacent to each other in the row direction (the transverse direction, the extending direction of the scanning lines), the subpixels SP4 and SP5 are adjacent to each other in the row direction, the subpixels SP6 and SP7 are adjacent to each other in the row direction, the subpixels SP9 and SP10 are adjacent to each other in the row direction, the subpixels SP3 is adjacent to the subpixels SP1, SP2, SP4, and SP5 in the column direction, and the subpixel SP8 is adjacent to the subpixels SP6, SP7, SP9, and SP10 in the column direction.

With regard to the subpixels SP1 to SP5 (the first to the fifth subpixels), the light-emitting region of the subpixel SP3 has a horizontally long rectangular shape (the long sides are parallel to the row direction, and the short sides are parallel to the column direction), and the light-emitting region of each of the subpixel SP1, the subpixel SP2, the subpixel SP4, and the subpixel SP5 is a vertically long rectangular shape including a side along the light-emitting region of the subpixel SP3, and is smaller than the light-emitting region of the subpixel SP3. Note that the size ratio of the row direction and the column direction of the light-emitting region (two pixels) formed of the subpixels SP1 to SP5 may be 1:2.

In this case, the subpixels SP1, SP3, and SP2 are connected to the scanning line SC1, the subpixels SP4, SP23, and SP5 are connected to the scanning line SC2, the subpixels SP6, SP8, and SP7 are connected to the scanning line SC3, and the subpixels SP9, SP28, and SP10 are connected to the scanning line SC4.

According to the configuration in FIG. 6, a frequency of a potential signal to be supplied to the data lines (DLr, DLb, DLg) can be suppressed low, and hence the charging rate of the capacitance Cp of the subpixel can be increased.

In a case where the rectangular light-emitting region PA2 is divided into five subpixels, an interval area between the subpixels can be minimized, and an opening ratio can be maximized.

Figure 7:
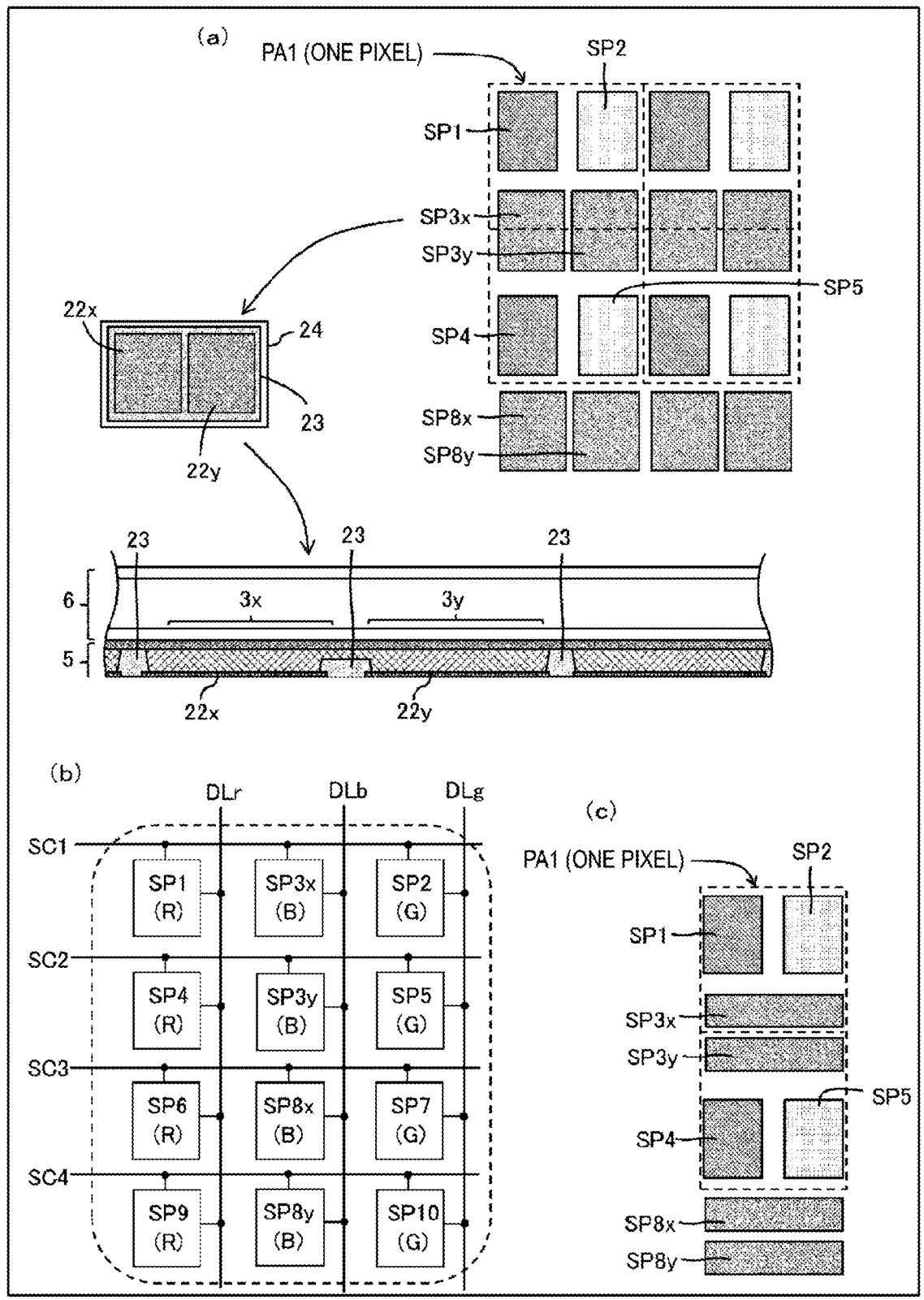
FIG. 7 is a schematic view illustrating a modification example of FIG. 6.

FIG. 7 is a schematic view illustrating a modification example of FIG. 6. As illustrated in FIG. 7(a), the blue subpixel in FIG. 6 may be divided into two subpixels arrayed in the row direction, and a common light-emitting layer may be provided to those two subpixels. For example, the following configuration is adopted. Specifically, the rectangular anode electrode 22x and the rectangular anode electrode 22y are arrayed in the row direction, the subpixel SP3x including the anode electrode 22x and the subpixel SP3y including the anode electrode 22y share one light-emitting layer 24 (blue), each of the subpixels SP3x and SP3y includes, for example, the configuration in FIG. 2, the subpixel SP3x is adjacent to the subpixel SP1 and the subpixel SP4 in the column direction (the light-emitting region of each of the subpixels SP1 and SP4 includes a side along the light-emitting region of the subpixel SP3x in the row direction), and the subpixel SP3y is adjacent to the subpixel SP2 and the subpixel SP5 in the column direction (the light-emitting region of each of the subpixels SP2 and SP5 includes a side along the light-emitting region of the subpixel SP3y in the row direction).

In this case, as illustrated in FIG. 7(b), the subpixel SP3x is connected to the data line DLb and the scanning line SC1, and the subpixel SP3y is connected to the data line DLb and the scanning line SC2. In this manner, substantially real display (SPR ratio=1) can be achieved.

Note that, as illustrated in FIG. 7(c), the following configuration may be adopted. That is, the rectangular anode electrode 22x and the rectangular anode electrode 22y are adjacent to each other in the column direction, the subpixel SP3x including the anode electrode 22x and the subpixel SP3y including the anode electrode 22y share one light-emitting layer 24 (blue), each of the subpixels SP3x and SP3y includes, for example, the configuration in FIG. 2, the subpixel SP3x is adjacent to the subpixel SP1 and the subpixel SP2 in the column direction (the light-emitting region of each of the subpixels SP1 and SP2 includes a side along the light-emitting region of the subpixel SP3x in the row direction), and the subpixel SP3y is adjacent to the subpixel SP4 and the subpixel SP5 in the column direction (the light-emitting region of each of the subpixels SP4 and SP5 includes a side along the light-emitting region of the subpixel SP3y in the row direction).

Third Embodiment

Figure 8:
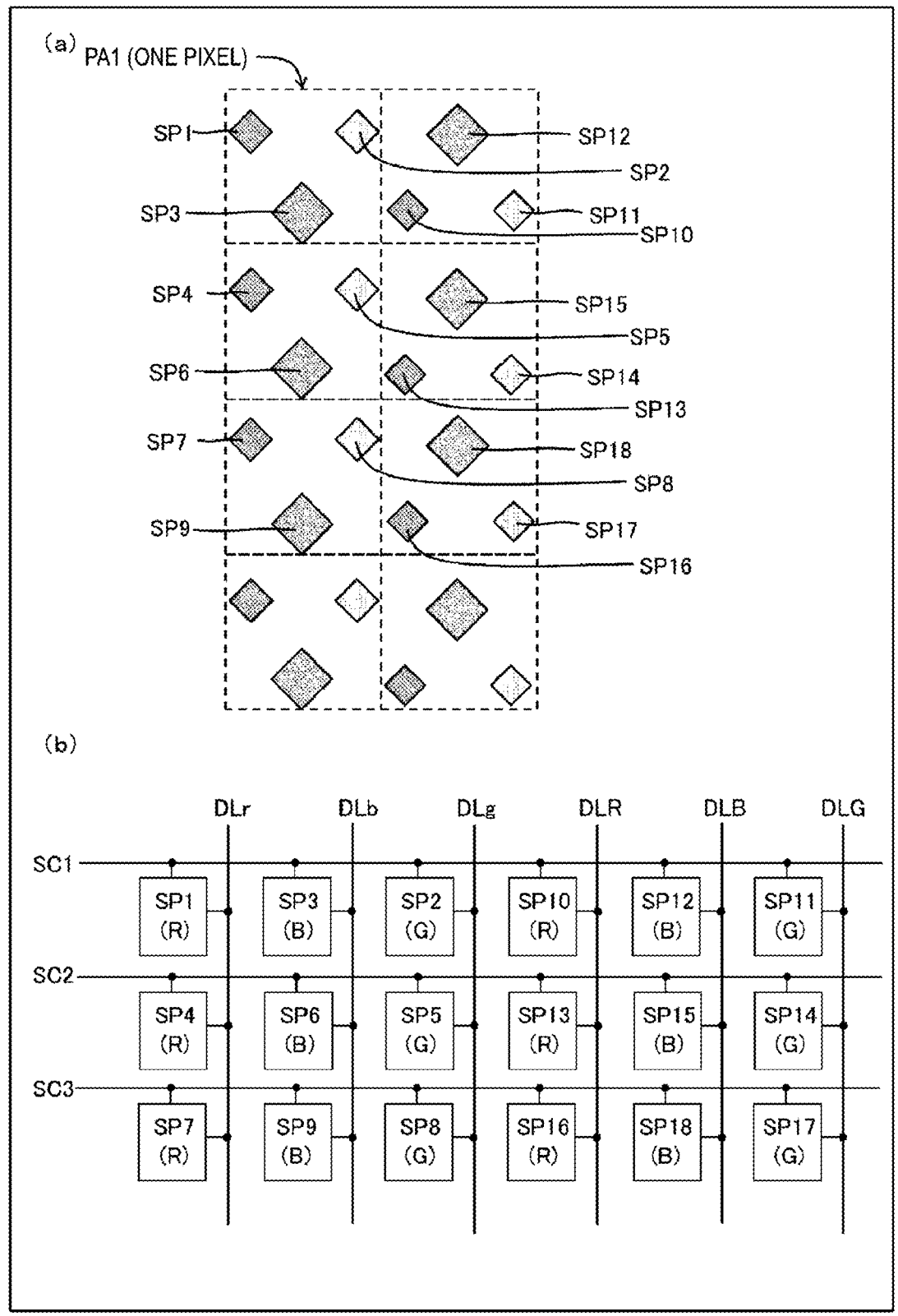
FIG. 8(a) is a schematic view illustrating arrangement of subpixels in a third embodiment.
FIG. 8(b) is a schematic view illustrating a connection relationship between the subpixels, scanning lines, and data lines.

FIG. 8(a) is a schematic view illustrating arrangement of subpixels in a third embodiment, and FIG. 8(b) is a schematic view illustrating a connection relationship between the subpixels, scanning lines, and data lines. In FIG. 8, an equivalent of six subpixels is included in two pixel areas, and the SPR ratio being an input/output ratio of the subpixel is 1. Note that the region PA1 (broken-line frame) in FIG. 8 corresponds to a one-pixel region.

In FIG. 8, three subpixels SP1, SP4, and SP7 each including a red light-emitting layer and having the same shape are arrayed in the column direction, and are connected to the data line DLr. Three subpixels SP3, SP6, and SP9 each including a blue light-emitting layer and having the same shape are arrayed in the column direction, and are connected to the data line DLb. Three subpixels SP2, SP5, and SP8 each including a green light-emitting layer and having the same shape are arrayed in the column direction, and are connected to the data line DLg. Three subpixels SP10, SP13, and SP16 each including a red light-emitting layer and having the same shape are arrayed in the column direction, and are connected to a data line DLR.

The subpixels SP1 and SP2 are adjacent to each other in the row direction, the subpixels SP3 and SP10 are adjacent to each other in the row direction, the subpixels SP4 and SP5 are adjacent to each other in the row direction, the subpixels SP6 and SP13 are adjacent to each other in the row direction, the subpixels SP7 and SP8 are adjacent to each other in the row direction, the subpixels SP9 and SP16 are adjacent to each other in the row direction, the subpixels SP3 are adjacent to the subpixels SP1, SP2, SP4, and SP5 in the diagonal direction, and the subpixel SP6 is adjacent to the subpixels SP4, SP5, SP7, and SP8 in the column direction. In other words, the subpixels SP1, SP3, SP4, SP6, SP7, and SP9 are arranged in the stated order in a staggered manner, and the subpixels SP2, SP10, SP5, SP13, SP8, and SP16 are arranged in the stated order in a staggered manner.

With regard to the subpixels SP1 to SP5 (the first to the fifth subpixels), the light-emitting region of the subpixel SP3 has a rhombic shape (a square having one diagonal line parallel to the row direction and the other diagonal line parallel to the column direction), and the light-emitting region of each of the subpixel SP1, the subpixel SP2, the subpixel SP4, and the subpixel SP5 has a rhombic shape including a side along the light-emitting region of the subpixel SP3 (a square having one diagonal line parallel to the row direction and the other diagonal line parallel to the column direction), and is smaller than the light-emitting region of the subpixel SP3. Note that the light-emitting region of each of the subpixels SP1 to SP3 may be any one of a circular shape or an elliptical shape.

In this case, the subpixels SP1, SP3, SP2, SP10, SP12, and SP11 are connected to the scanning line SC1, the subpixels SP4, SP6, SP5, SP13, SP15, and SP14 are connected to the scanning line SC2, and the subpixel SP7, SP9, SP8, SP16, SP18, and SP17 are connected to the scanning line SC3.

According to the configuration in FIG. 8, a frequency of a potential signal to be supplied to the data lines (DLr, DLb, DLg, or the like) can be suppressed low, and hence the charging rate of the capacitance Cp of the subpixel can be increased.

Further, the red subpixels (SP1 and the like), the green subpixels (SP2 and the like), and the blue subpixels (SP3 and the like) are formed in a geometrically similar shape (rhombic shape), and the red subpixels (SP1 and the like) and the green subpixels (SP2 and the like) have the same shape, and are smaller than the blue subpixels (SP3 and the like). Thus, a resolution can be improved while securing pitches between the subpixels, and real display with delta arrangement (the SPR ratio=1) can be achieved as illustrated in FIG. 8(a).

Fourth Embodiment

Figure 9:
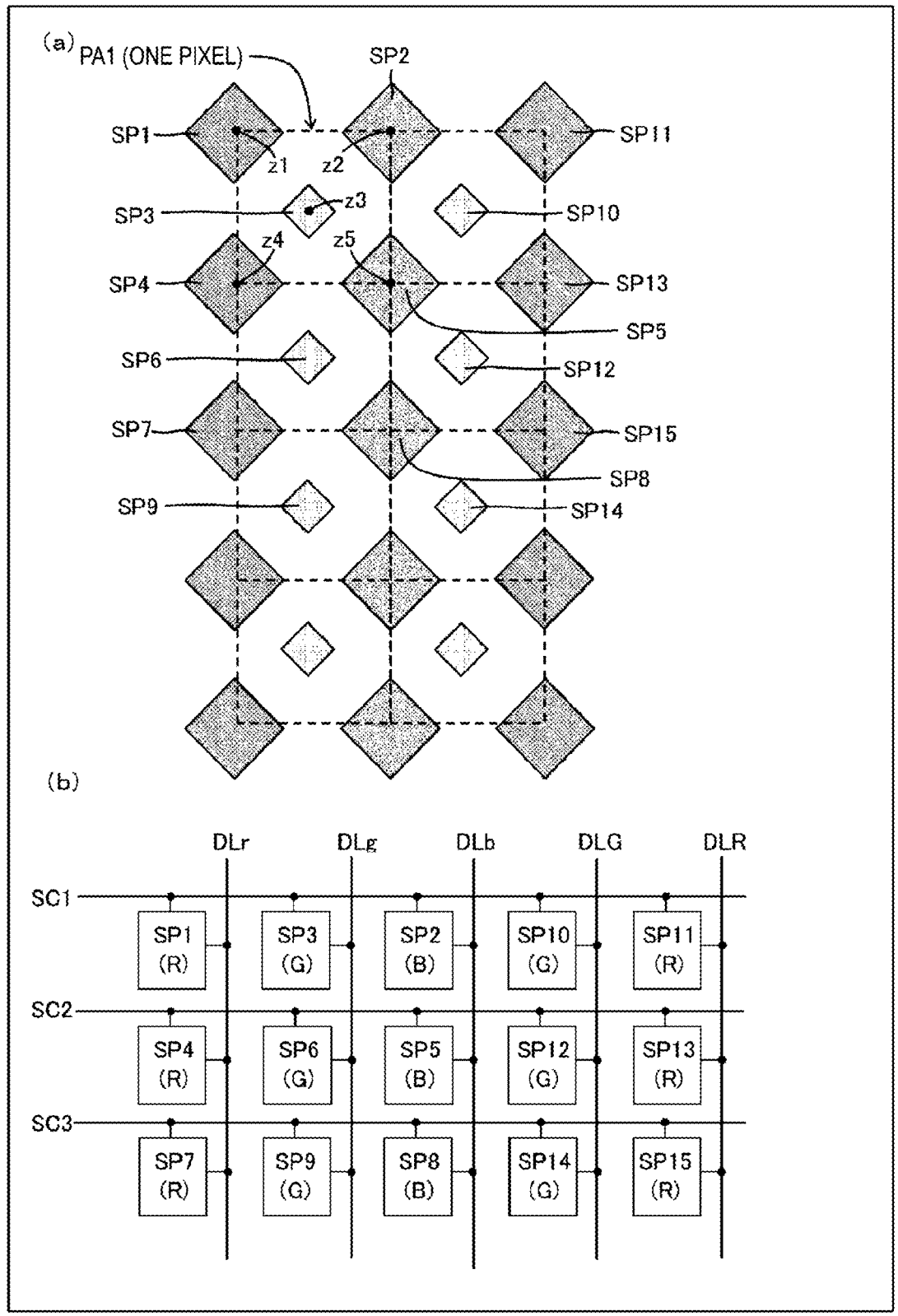
FIG. 9(a) is a schematic view illustrating arrangement of subpixels in a fourth embodiment.
FIG. 9(b) is a schematic view illustrating a connection relationship between the subpixels, scanning lines, and data lines.

FIG. 9(a) is a schematic view illustrating arrangement of subpixels in a fourth embodiment, and FIG. 9(b) is a schematic view illustrating a connection relationship between the subpixels, scanning lines, and data lines. In FIG. 9, an equivalent of four subpixels is included in two pixel areas, and the SPR ratio being an input/output ratio of the subpixel is 2/3. Note that the region PA1 (broken-line frame) in FIG. 9 corresponds to a one-pixel region.

In FIG. 9, three subpixels SP1, SP4, and SP7 each including a red light-emitting layer and having the same shape are arrayed in the column direction, and are connected to the data line DLr. Three subpixels SP3, SP6, and SP9 each including a green light-emitting layer and having the same shape are arrayed in the column direction, and are connected to the data line DLg. Three subpixels SP2, SP5, and SP8 each including a blue light-emitting layer and having the same shape are arrayed in the column direction, and are connected to the data line DLb. Three subpixels SP10, SP12, and SP14 each including a green light-emitting layer and having the same shape are arrayed in the column direction, and are connected to a data line DLG.

The subpixels SP1 and SP2 are adjacent to each other in the row direction, the subpixels SP3 and SP10 are adjacent to each other in the row direction, the subpixels SP4 and SP5 are adjacent to each other in the row direction, the subpixels SP6 and SP12 are adjacent to each other in the row direction, the subpixels SP7 and SP8 are adjacent to each other in the row direction, the subpixels SP9 and SP14 are adjacent to each other in the row direction, the subpixel SP3 is adjacent to the subpixels SP1, SP2, SP4, and SP5 in the diagonal direction, and the subpixel SP6 is adjacent to the subpixels SP4, SP5, SP7, and SP8 in the diagonal direction. In other words, the subpixels SP1, SP3, SP4, SP6, SP7, and SP9 are arranged in the stated order in a staggered manner, and the subpixels SP2, SP10, SP5, SP12, SP8, and SP14 are arranged in the stated order in a staggered manner.

With regard to the subpixels SP1 to SP5 (the first to the fifth subpixels), the light-emitting region of the subpixel SP3 has a rhombic shape (a square having one diagonal line parallel to the row direction and the other diagonal line parallel to the column direction), and the light-emitting region of each of the subpixel SP1, the subpixel SP2, the subpixel SP4, and the subpixel SP5 has a rhombic shape including a side along the light-emitting region of the subpixel SP3 (a square having one diagonal line parallel to the row direction and the other diagonal line parallel to the column direction), and is larger than the light-emitting region of the subpixel SP3. A square region obtained by connecting centroids of the light-emitting regions of the subpixel SP1, the subpixel SP2, the subpixel SP4, and the subpixel SP5 (intersection points z1, z2, z4, and z5 each being an intersection point of two diagonal lines) (the region includes the subpixel SP3) corresponds to the one-pixel region PA1 Note that the light-emitting region of each of the subpixels SP1 to SP3 may be any one of a circular shape or an elliptical shape. The configuration in which the centroid of the square region (one-pixel region) overlaps with the centroid of the light-emitting region of the subpixel SP3 may be adopted.

In this case, the subpixels SP1, SP3, SP2, SP10, and SP11 are connected to the scanning line SC1, the subpixels SP4, SP6, SP5, SP12, and SP13 are connected to the scanning line SC2, and the subpixels SP7, SP9, SP8, and SP14, SP15 are connected to the scanning line SC3.

According to the configuration in FIG. 9, a frequency of a potential signal to be supplied to the data lines (DLr, DLb, DLg, or the like) can be suppressed low, and hence the charging rate of the capacitance Cp of the subpixel can be increased.

Figure 10:
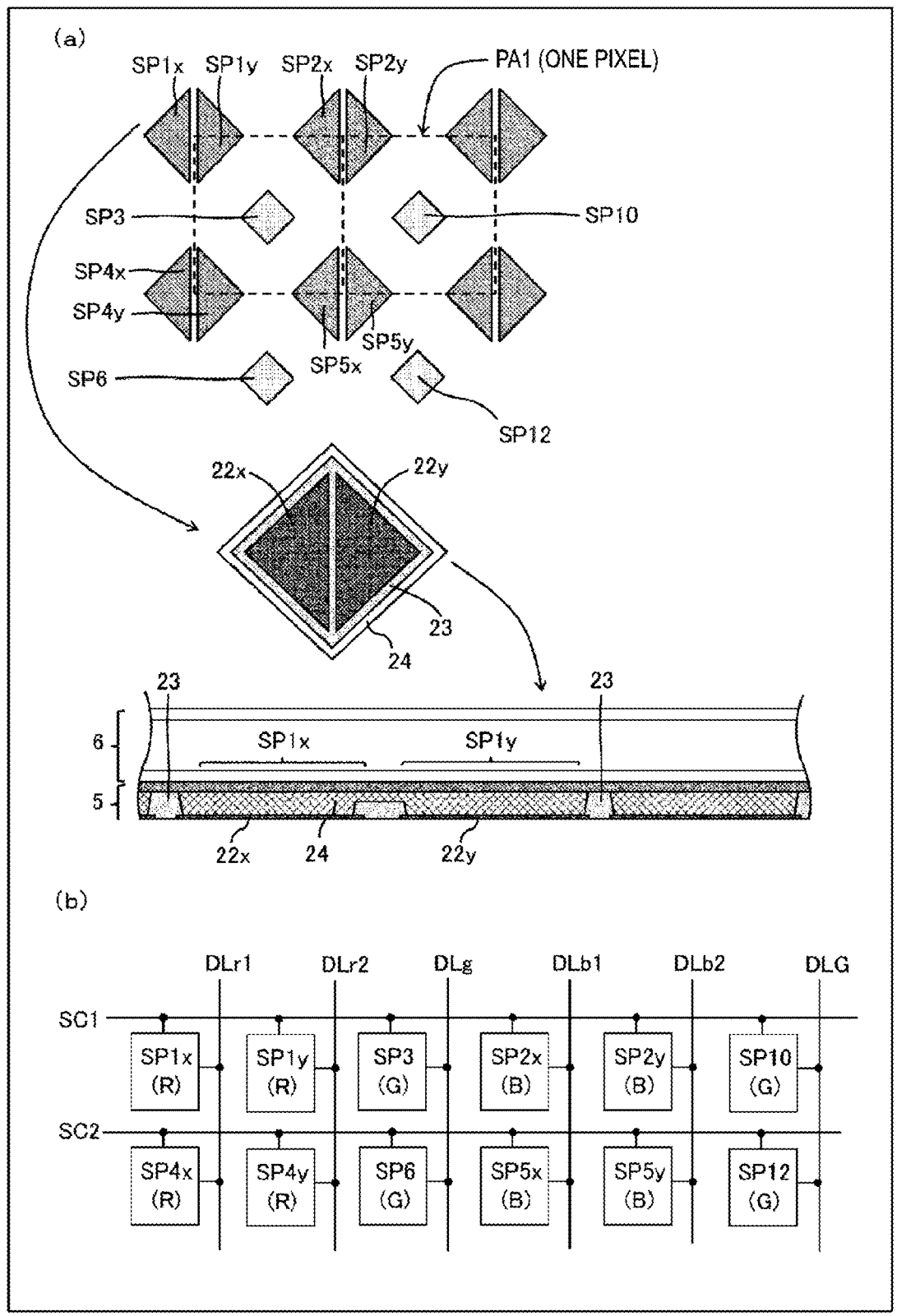
FIG. 10 is a schematic view illustrating a modification example of FIG. 9.

FIG. 10 is a schematic view illustrating a modification example of FIG. 9. As illustrated in FIG. 10(a), each of the red subpixels and the blue subpixels in FIG. 9 may be divided into two subpixels arrayed in the row direction, a light-emitting layer common to the two subpixels may be provided. For example, the following configuration is adopted. Specifically, the base of the isosceles triangle anode electrode 22x and the base of the isosceles triangle anode electrode 22y are adjacent to each other in the column direction, a subpixel SP1x including the anode electrode 22x and a subpixel SP1y including the anode electrode 22y share one light-emitting layer 24 (red), each of the subpixels SP1x and SP1y includes, for example, the configuration in FIG. 2, and the subpixel SP1y is adjacent to the subpixel SP3 in the diagonal direction (the light-emitting region of the subpixel SP1y includes an oblique side along the light-emitting region of the subpixel SP3). Note that subpixels SP4y, SP2x, and SP5x are adjacent to the subpixel SP3 in the diagonal direction.

In this case, as illustrated in FIG. 10(b), the subpixel SP1x is connected to the data line DLr1 and the scanning line SC1, the subpixel SP1y is connected to the data line DLr2 and the scanning line SC1, the subpixel SP4x is connected to the data line DLr1 and the scanning line SC2, the subpixel SP4y is connected to the data line DLr2 and the scanning line SC2, the subpixel SP2x is connected to the data line DLb1 and the scanning line SC1, the subpixel SP2y is connected to the data line DLb2 and the scanning line SC1, the subpixel SP5x is connected to the data line DLb1 and the scanning line SC2, and the subpixel SP5y is connected to the data line DLb2 and the scanning line SC2. In this manner, substantially real display (SPR ratio=1) can be achieved.

Figure 11:
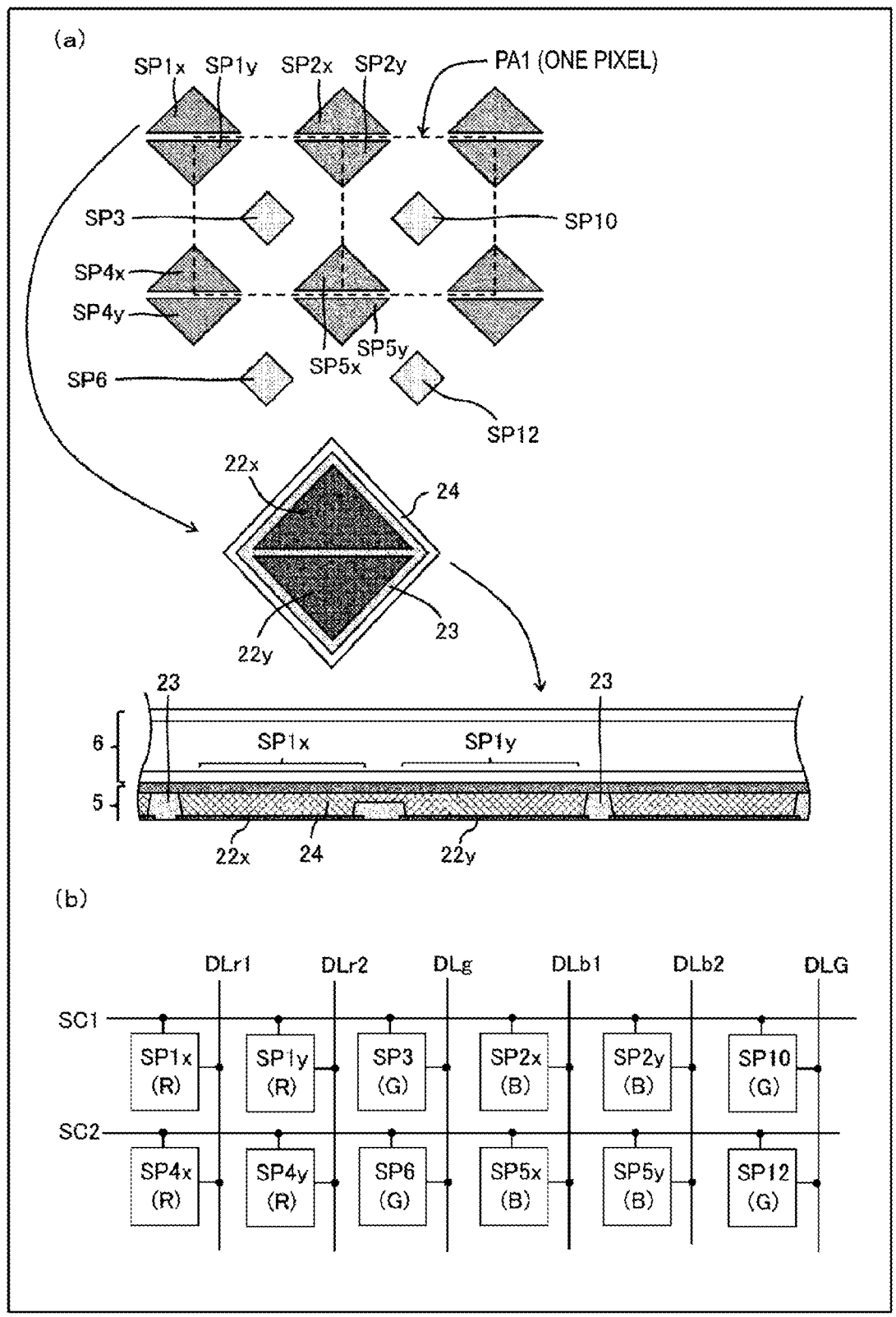
FIG. 11 is a schematic view illustrating another modification example of FIG. 9.

Note that a configuration in which each of the red subpixels and the blue subpixels in FIG. 9 is divided into two subpixels arrayed in the column direction may be adopted as in FIG. 11. In FIG. 11, the subpixels SP1y, SP4x, SP2y, and SP5x are adjacent to the subpixel SP3 in the diagonal direction.

Fifth Embodiment

Figure 12:
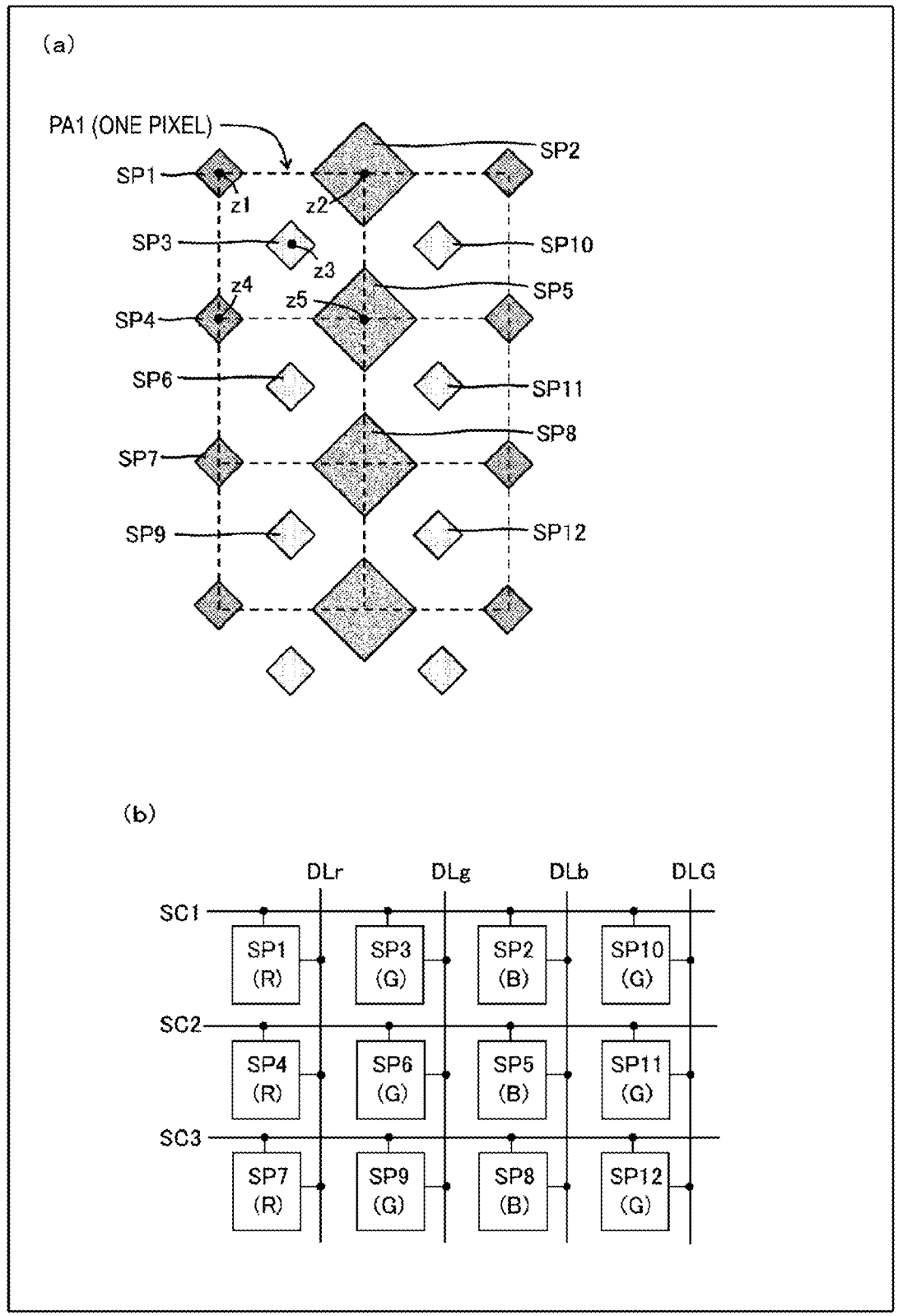
FIG. 12(a) is a schematic view illustrating arrangement of subpixels in a fifth embodiment.
FIG. 12(b) is a schematic view illustrating a connection relationship between the subpixels, scanning lines, and data lines.

FIG. 12(a) is a schematic view illustrating arrangement of subpixels in a fifth embodiment, and FIG. 12(b) is a schematic view illustrating a connection relationship between the subpixels, scanning lines, and data lines. In FIG. 12, an equivalent of four subpixels is included in two pixel areas, and the SPR ratio being an input/output ratio of the subpixel is 2/3. Note that the region PA1 (broken-line frame) in FIG. 12 corresponds to a one-pixel region.

In FIG. 12, three subpixels SP1, SP4, and SP7 each including a red light-emitting layer and having the same shape are arrayed in the column direction, and are connected to the data line DLr. Three subpixels SP3, SP6, and SP9 each including a green light-emitting layer and having the same shape are arrayed in the column direction, and are connected to the data line DLg. Three subpixels SP2, SP5, and SP8 each including a blue light-emitting layer and having the same shape are arrayed in the column direction, and are connected to the data line DLb. Three subpixels SP10, SP11, and SP12 each including a green light-emitting layer and having the same shape are arrayed in the column direction, and are connected to the data line DLG.

The subpixels SP1 and SP2 are adjacent to each other in the row direction, the subpixels SP3 and SP10 are adjacent to each other in the row direction, the subpixels SP4 and SP5 are adjacent to each other in the row direction, the subpixels SP6 and SP11 are adjacent to each other in the row direction, the subpixels SP7 and SP8 are adjacent to each other in the row direction, the subpixels SP9 and SP12 are adjacent to each other in the row direction, the subpixel SP3 is adjacent to the subpixels SP1, SP2, SP4, and SP5 in the diagonal direction, and the subpixel SP6 is adjacent to the subpixels SP4, SP5, SP7, and SP8 in the diagonal direction. In other words, the subpixel SP1, SP3, SP4, SP6, SP7, SP9 are arranged in the stated order in a staggered manner, and the subpixel SP2, SP10, SP5, SP11, SP8, SP12 are arranged in the stated order in a staggered manner.

With regard to the subpixels SP1 to SP5 (the first to the fifth subpixels), the light-emitting region of the subpixel SP3 has a rhombic shape (a square having one diagonal line parallel to the row direction and the other diagonal line parallel to the column direction), and the light-emitting region of each of the subpixel SP1, the subpixel SP2, the subpixel SP4, and the subpixel SP5 has a rhombic shape including a side along the light-emitting region of the subpixel SP3 (a square having one diagonal line parallel to the row direction and the other diagonal line parallel to the column direction). A square region obtained by connecting centroids of the light-emitting regions of the subpixel SP1, the subpixel SP2, the subpixel SP4, and the subpixel SP5 (intersection points z1, z2, z4, and z5 each being an intersection point of two diagonal lines) (the region includes the subpixel SP3) corresponds to the one-pixel region PAL Note that the light-emitting region of each of the subpixels SP1 to SP3 may be any one of a circular shape or an elliptical shape. The configuration in which the centroid of the square region (one-pixel region) overlaps with the centroid of the light-emitting region of the subpixel SP3 may be adopted.

In this case, the subpixel SP1, SP3, SP2, SP10 are connected to the scanning line SC1, the subpixels SP4, SP6, SP5, and SP11 are connected to the scanning line SC2, and the subpixel SP7, SP9, SP8, SP12 are connected to the scanning line SC3.

According to the configuration in FIG. 12, a frequency of a potential signal to be supplied to the data lines (DLr, DLb, DLg, or the like) can be suppressed low, and hence the charging rate of the capacitance Cp of the subpixel can be increased.

Further, the red subpixels (SP1 and the like), the blue subpixels (SP2 and the like), and the green subpixels (SP3 and the like) are formed in a geometrically similar shape (rhombic shape), and the red subpixels (SP1 and the like) and the green subpixels (SP3 and the like) have the same shape, and are smaller than the blue subpixels (SP2 and the like). Thus, a resolution can be improved while securing pitches between the subpixels.

Figure 13:
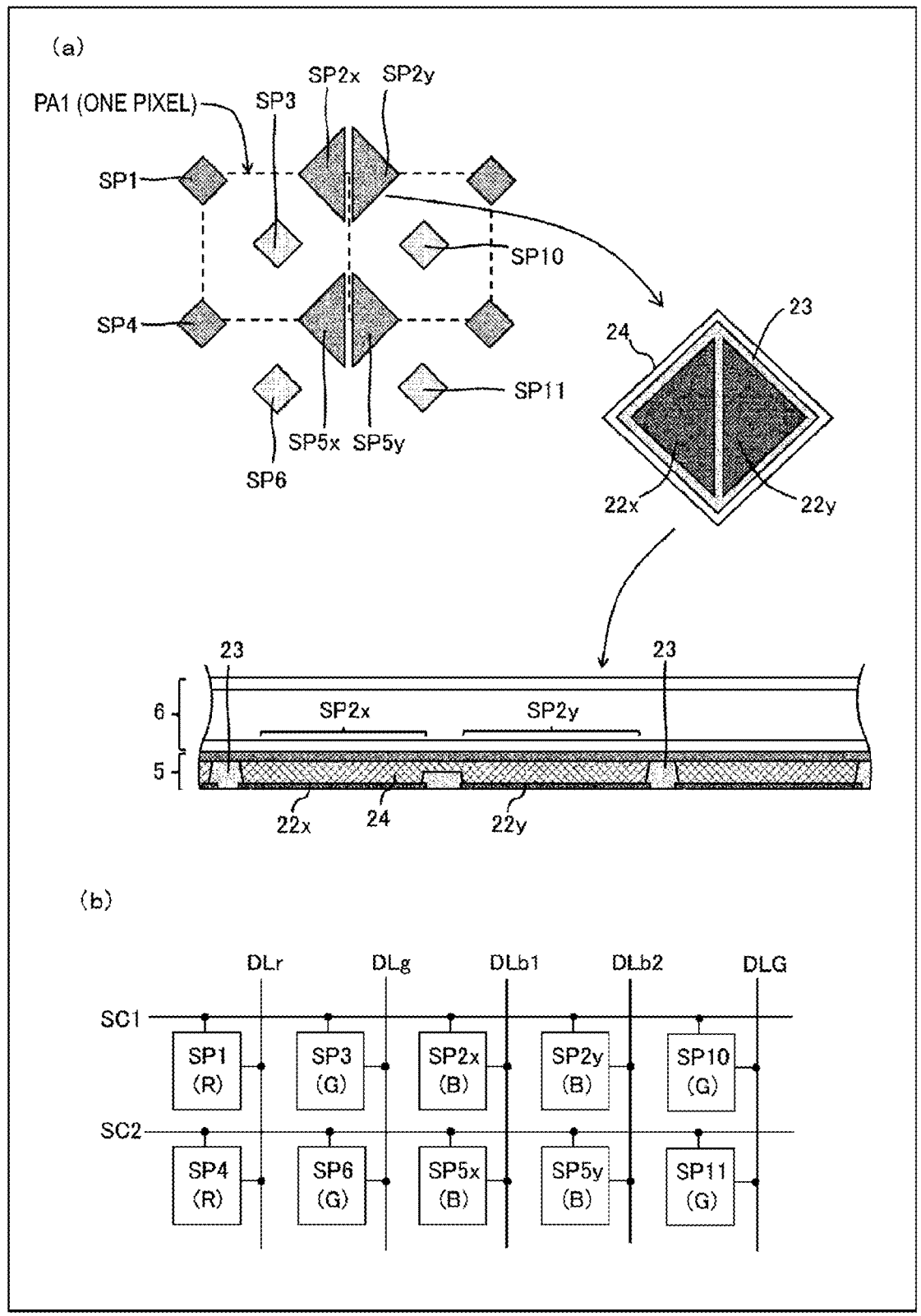
FIG. 13 is a schematic view illustrating a modification example of FIG. 12.

FIG. 13 is a schematic view illustrating a modification example of FIG. 12. As illustrated in FIG. 13(a), the blue subpixel in FIG. 12 may be divided into two subpixels arrayed in the row direction, and a light-emitting layer common to the two subpixels may be provided. For example, the following configuration is adopted. Specifically, the base of the isosceles triangle anode electrode 22x and the base of the isosceles triangle anode electrode 22y are adjacent to each other in the row direction, the subpixel SP2x including the anode electrode 22x and the subpixel SP2y including the anode electrode 22y share one light-emitting layer 24 (blue), each of the subpixels SP2x and SP2y includes, for example, the configuration in FIG. 2, and the subpixel SP2x is adjacent to the subpixel SP3 in the diagonal direction (the light-emitting region of the subpixel SP2x includes an oblique side along the light-emitting region of the subpixel SP3).

In this case, as illustrated in FIG. 13(b), the subpixel SP2x is connected to the data line DLb1 and the scanning line SC1, the subpixel SP2y is connected to the data line DLb2 and the scanning line SC1, the subpixel SP5x is connected to the data line DLb1 and the scanning line SC2, and the subpixel SP5y is connected to the data line DLb2 and the scanning line SC2. In this manner, the SPR ratio can be increased to 5/6.

Figure 14:
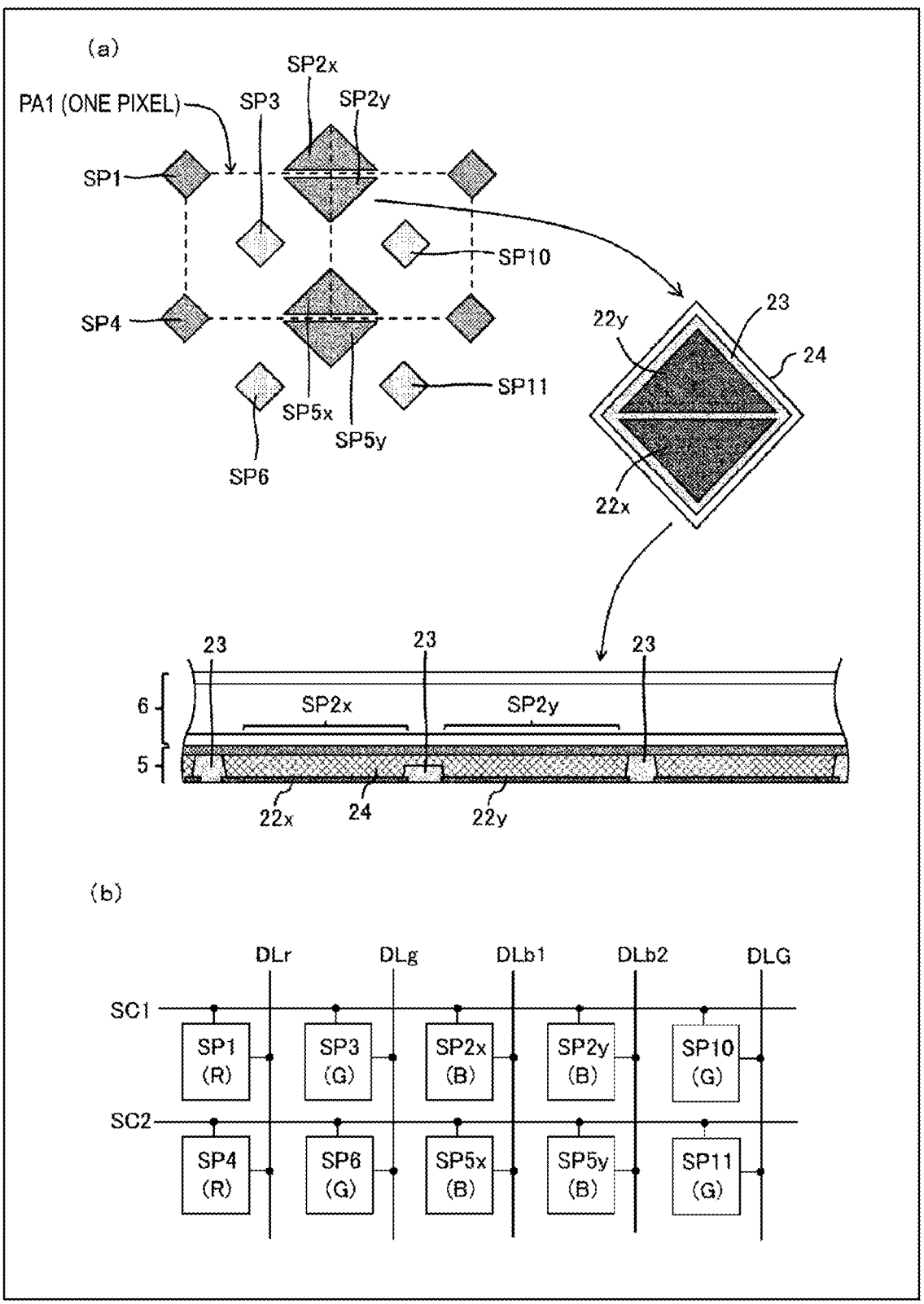
FIG. 14 is a schematic view illustrating another modification example of FIG. 12.

Note that the configuration in which each of the blue subpixels in FIG. 12 is divided into two subpixels arrayed in the column direction may be adopted as in FIG. 14. In FIG. 14, the subpixels SP1, SP4, SP2y, and SP5x are adjacent to the subpixel SP3 in the diagonal direction.

Supplement

An electro-optical element (an electro-optical element whose luminance and transmittance are controlled by an electric current) that is provided in a display device according to the present embodiment is not particularly limited thereto. Examples of the display device according to the present embodiment include an organic Electro Luminescence (EL) display provided with the Organic Light Emitting Diode (OLED) as the electro-optical element, an inorganic EL display provided with an inorganic light emitting diode as the electro-optical element, and a Quantum dot Light Emitting Diode (QLED) display provided with a QLED as the electro-optical element.

The disclosure is not limited to the embodiments stated above. Embodiments obtained by appropriately combining technical approaches stated in each of the different embodiments also fall within the scope of the technology of the disclosure. Moreover, novel technical features can be formed by combining the technical approaches disclosed in the embodiments.

When a shape, a state, a size, and the like are specified in the embodiments, the shape, the state, the size, and the like are not required to strictly match with those in the embodiments. Even when those do not strictly match, the present embodiments encompass a range that achieves the object, the functions, the effects, and the like (the range that can be said as substantial match).

First Aspect

A display device including:

a first subpixel and a second subpixel that are adjacent to each other in a row direction;

a third subpixel; and a fourth subpixel and a fifth subpixel that are adjacent to each other in the row direction, wherein each of the first subpixel and the fourth subpixel that are arrayed in a column direction includes a first-color light-emitting layer, each of the second subpixel and the fifth subpixel that are arrayed in the column direction includes a second-color light-emitting layer, and the third subpixel including a third-color light-emitting layer is adjacent in a diagonal direction to or adjacent in the column direction to at least two of the first subpixel, the second subpixel, the fourth subpixel, and the fifth subpixel.

Second Aspect

The display device, for example according to the first aspect, further including a first data line, a second data line, and a third data line that extend in the column direction, wherein the first subpixel and the fourth subpixel are connected to the first data line, the second subpixel and the fifth subpixel are connected to the second data line, and the third subpixel are connected to the third data line.

Third Aspect

The display device, for example according to the second aspect, further including a first scanning line and a second scanning line that extend in the row direction wherein the first subpixel and the second subpixel and connected to the first scanning line, and the third subpixel is connected to one of the first scanning line and the second scanning line.

Fourth Aspect

The display device, for example according to any one of the first aspect to the third aspect, wherein a light-emitting region of the third subpixel has a rhombic shape, and the first subpixel, the second subpixel, the fourth subpixel, and the fifth subpixel are adjacent to the third subpixel in a diagonal direction.

Fifth Aspect

The display device, for example according to the fourth aspect, wherein a light-emitting region of each of the first subpixel, the second subpixel, the fourth subpixel, and the fifth subpixel has one of a pentagonal shape and a triangular shape (including a case of a substantially pentagonal shape or a substantially triangular shape).

Sixth Aspect

The display device, for example according to the fourth aspect, wherein a light-emitting region of each of the first subpixel, the second subpixel, the fourth subpixel, and the fifth subpixel has a rhombic shape (including a case of a substantially rhombic shape).

Seventh Aspect

The display device, for example according to any one of the first aspect to the third aspect, wherein a light-emitting region of the third subpixel is a rectangular shape, and the first subpixel, the second subpixel, the fourth subpixel, and the fifth subpixel are adjacent to the third subpixel in the column direction.

Eighth Aspect

The display device, for example according to the fifth aspect or the seventh aspect, wherein a size ratio of the row direction and the column direction of the light-emitting region formed with the first subpixel to the fifth subpixel is 1:2 (including a case of 1:2 substantially).

Ninth Aspect

The display device, for example according to any one of the first aspect to the eighth aspect, wherein the third subpixel has a light-emitting region larger than the first subpixel and the second subpixel.

Tenth Aspect

The display device, for example according to any one of the first aspect to the third aspect, wherein the light-emitting region of each of the first subpixel to the fifth subpixel has any one of a rhombic shape, a triangular shape, a circular shape, and an elliptical shape (including a case the shape is substantially a rhombic shape, a triangular shape, a circular shape, or an elliptical shape).

Eleventh Aspect

The display device, for example according to any one of the first aspect to the tenth aspect, wherein an equivalent of five subpixels is included in two pixel areas.

Twelfth Aspect

The display device, for example according to the eleventh aspect, wherein the third subpixel and subpixels other than the first subpixel to the fifth subpixel share a light-emitting layer, and include anode electrodes that are electrically separated, and signals are input independently to the anode electrodes.

Thirteenth Aspect

The display device, for example according to any one of the first aspect to the tenth aspect, wherein an equivalent of six subpixels is included in two pixel areas.

Fourteenth Aspect

The display device, for example according to any one of the first aspect to the tenth aspect, wherein an equivalent of four subpixels is included in two pixel areas.

Fifteenth Aspect

The display device, for example according to the fourteenth aspect, wherein the third subpixel has a light-emitting region smaller than at least one of the first subpixel and the second subpixel.

Sixteenth Aspect

The display device, for example according to the fifteenth aspect, wherein the first subpixel and the third subpixel have the same shape, and each include a light-emitting region smaller than the second subpixel.

Seventeenth Aspect

The display device, for example according to any one of the fourteenth aspect to the sixteenth aspect, wherein at least one of the first subpixel and the second subpixel and the subpixels other than the first subpixel to the fifth subpixel share a light-emitting layer, and include anode electrodes that are electrically separated, and signals are input independently to the anode electrodes.

Eighteenth Aspect

The display device, for example according to any one of the eleventh aspect to the thirteenth aspect, wherein the first color is red, the second color is green, and the third color is blue.

Nineteenth Aspect

The display device, for example according to any one of the fourteenth aspect to the seventeenth aspect, wherein the first color is red, the second color is blue, and the third color is green.

Twentieth Aspect

The display device, for example according to the fourteenth aspect, wherein a rectangular region obtained by connecting centroids of the light-emitting regions of the first subpixel, the second subpixel, the fourth subpixel, and the fifth subpixel is equivalent to one-pixel region.

Twenty-First Aspect

The display device, for example according to the twentieth aspect, wherein a centroid of the rectangular region matches with a centroid of the light-emitting region of the third subpixel.

Twenty-Second Aspect

The display device, for example according to any one of the first aspect to the twenty-first aspect, wherein the light-emitting layer includes an organic EL layer.

Twenty-Third Aspect

The display device, for example according to any one of the first aspect to the twenty-first aspect, wherein the light-emitting layer includes a quantum dot layer.

REFERENCE SIGNS LIST

2 Display device
4 TFT layer
5 Light-emitting element layer
6 Sealing layer
10 Base material
12 Resin layer
21 Flattening film
22 Anode electrode
23 Bank
24 Light-emitting layer
25 Cathode electrode
NA Non-active area
DA Active area
SP1 to SP5 Subpixel (first to fifth subpixels)
DLr, DLg, DLb Data line

The invention claimed is:

1. A display device comprising:
   a first subpixel and a second subpixel that are adjacent to each other in a row direction;
   a third subpixel; and
   a fourth subpixel and a fifth subpixel that are adjacent to each other in the row direction,
   wherein each of the first subpixel and the fourth subpixel that are arrayed in a column direction includes a first-color light-emitting layer,
   each of the second subpixel and the fifth subpixel that are arrayed in the column direction includes a second-color light-emitting layer, and
   the third subpixel including a third-color light-emitting layer is adjacent in a diagonal direction to or adjacent in the column direction to at least two of the first subpixel, the second subpixel, the fourth subpixel, and the fifth subpixel,
   wherein an equivalent of four subpixels is included in two pixel areas, and
   wherein at least one of the first subpixel and the second subpixel and the subpixels other than the first subpixel to the fifth subpixel share a light-emitting layer, and include anode electrodes that are electrically separated, and signals are input independently to the anode electrodes.

2. The display device according to claim 1, further comprising:
   a first data line, a second data line, and a third data line that extend in the column direction,
   wherein the first subpixel and the fourth subpixel are connected to the first data line, the second subpixel and the fifth subpixel are connected to the second data line, and the third subpixel is connected to the third data line.

3. The display device according to claim 2, further comprising:
   a first scanning line and a second scanning line that extend in the row direction,
   wherein the first subpixel and the second subpixel are connected to the first scanning line, and the third subpixel is connected to one of the first scanning line and the second scanning line.

4. The display device according to claim 1,
   wherein a light-emitting region of the third subpixel has a rhombic shape, and the first subpixel, the second subpixel, the fourth subpixel, and the fifth subpixel are adjacent to the third subpixel in the diagonal direction.

5. The display device according to claim 4,
   wherein a light-emitting region of each of the first subpixel, the second subpixel, the fourth subpixel, and the fifth subpixel has one of a pentagonal shape and a triangular shape.

6. The display device according to claim 5,
   wherein a size ratio of the row direction and the column direction of the light-emitting region formed with the first subpixel to the fifth subpixel is 1:2.

7. The display device according to claim 4,
   wherein a light-emitting region of each of the first subpixel, the second subpixel, the fourth subpixel, and the fifth subpixel has a rhombic shape.

8. The display device according to claim 1,
   wherein a light-emitting region of the third subpixel is a rectangular shape, and the first subpixel, the second subpixel, the fourth subpixel, and the fifth subpixel are adjacent to the third subpixel in the column direction.

9. The display device according to claim 1,
   wherein the third subpixel has a light-emitting region larger than the first subpixel and the second subpixel.

10. The display device according to claim 1,
    wherein a light-emitting region of each of the first subpixel to the fifth subpixel has any one of a rhombic shape, a triangular shape, a circular shape, and an elliptical shape.

11. The display device according to claim 1,
    wherein the third subpixel has a light-emitting region smaller than at least one of the first subpixel and the second subpixel.

12. The display device according to claim 11,
    wherein the first subpixel and the third subpixel have the same shape, and each include a light-emitting region smaller than the second subpixel.

13. The display device according to claim 1,
    wherein the first color is red, the second color is blue, and the third color is green.

14. A display device comprising:
    a first subpixel and a second subpixel that are adjacent to each other in a row direction;
    a third subpixel; and
    a fourth subpixel and a fifth subpixel that are adjacent to each other in the row direction,
    wherein each of the first subpixel and the fourth subpixel that are arrayed in a column direction includes a first-color light-emitting layer,
    each of the second subpixel and the fifth subpixel that are arrayed in the column direction includes a second-color light-emitting layer, and
    the third subpixel including a third-color light-emitting layer is adjacent in a diagonal direction to or adjacent in the column direction to at least two of the first subpixel, the second subpixel, the fourth subpixel, and the fifth subpixel,
    wherein an equivalent of four subpixels is included in two pixel areas, and
    wherein a rectangular region obtained by connecting centroids of the light-emitting regions of the first subpixel, the second subpixel, the fourth subpixel, and the fifth subpixel is equivalent to one-pixel region.

15. The display device according to claim 14,
    wherein a centroid of the rectangular region matches with a centroid of the light-emitting region of the third subpixel.

* * * * *